United States Patent [19]
Ishikawa et al.

[11] Patent Number: 5,700,414
[45] Date of Patent: Dec. 23, 1997

[54] HEAT-INSULATING PANEL SERVING AS CONCRETE FORM AND METHOD OF MANUFACTURING THE SAME

[75] Inventors: Yuukou Ishikawa; Noboru Nishimoto, both of Tokyo; Michio Ootani, Matsudo; Tooru Tanibe, Funabashi; Kazushige Suzuki, Tokyo; Kanesuke Kasahara, Atsugi, all of Japan

[73] Assignees: Nihon Cement Co. Ltd.; Fuji Kasei Kogyo Kabushiki Kaisha, both of Japan

[21] Appl. No.: 552,600

[22] Filed: Nov. 3, 1995

Related U.S. Application Data

[62] Division of Ser. No. 331,715, Oct. 31, 1994, Pat. No. 5,631,075.

[30] Foreign Application Priority Data

Mar. 23, 1994 [JP] Japan ................................. 6-51718

[51] Int. Cl.⁶ .................... B29C 70/02; B29C 70/04

[52] U.S. Cl. .................. 264/247; 264/246; 264/257; 264/349

[58] Field of Search ........................... 264/246, 247, 264/257, 349

Primary Examiner—Richard Weisberger
Attorney, Agent, or Firm—Fish & Richardson P.C.

[57] ABSTRACT

The present invention relates to a heat-insulating panel formed of curly contracted pieces of tapes, for example thermally contracted pieces of magnetic tapes, and a method of manufacturing such a panel. In particular, the present invention concerns a heat-insulating panel which also serves as a concrete form. The heat-insulating panel has excellent strength characteristics such, as bending strength and bending rigidity, and dimensional stability, as well as characteristics of sound absorption, heat-insulation, electrostatic shielding and electromagnetic wave absorption, and is usable for a concrete form when placing concrete during the construction of a building formed of reinforced concrete or steelframe reinforced concrete. The present invention relates also to a method of manufacturing the panel.

2 Claims, 1 Drawing Sheet

FIG.1A
FIG.1B
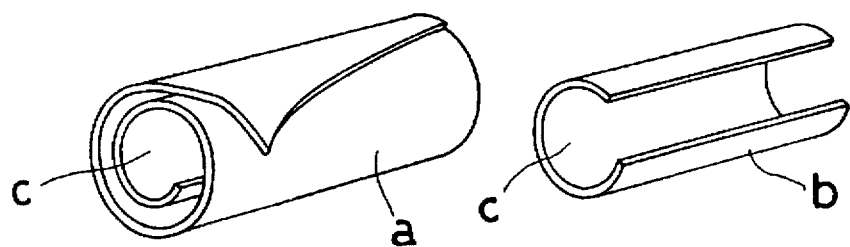
FIG.2
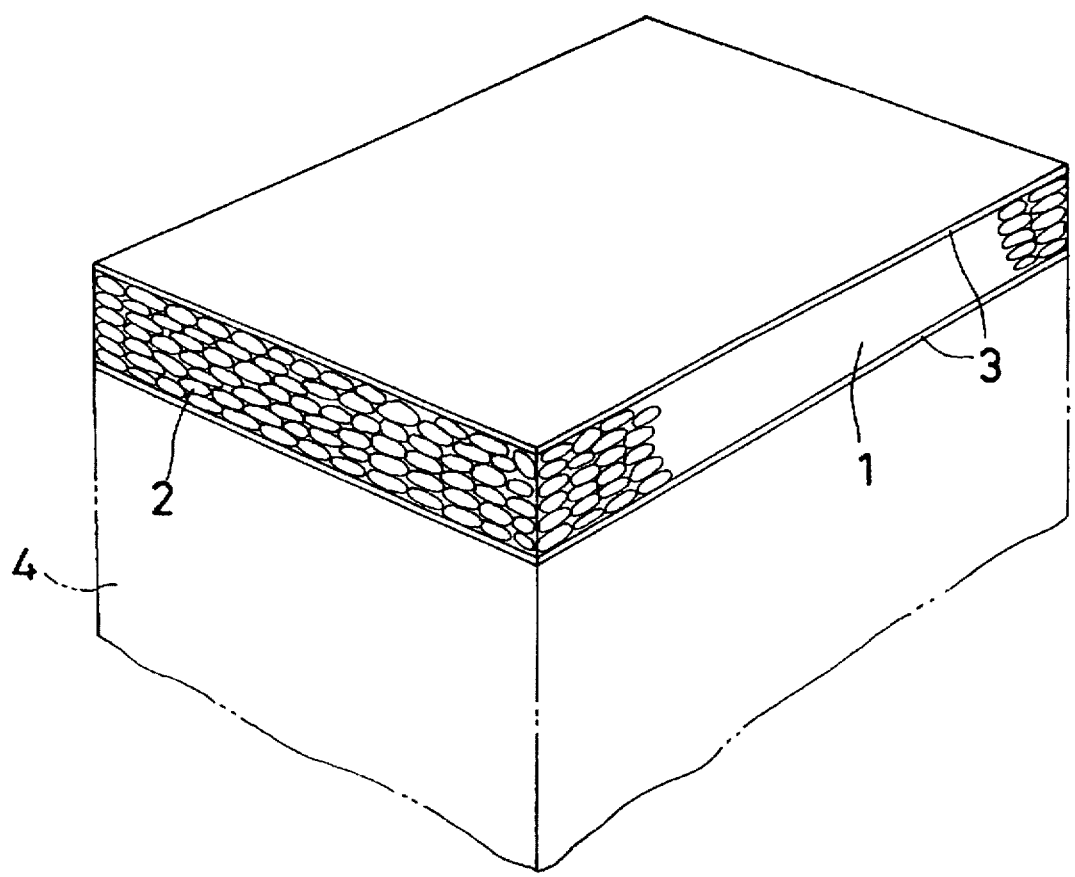

HEAT-INSULATING PANEL SERVING AS CONCRETE FORM AND METHOD OF MANUFACTURING THE SAME

This is a divisional of application Ser. No. 08/331,715, filed on Oct. 31, 1994, now U.S. Pat. No. 5,631,075.

FIELD OF THE INVENTION AND RELATED ART STATEMENT

The present invention relates to a heat-insulating panel formed of curly contracted pieces of tapes, for example thermally contracted pieces of magnetic tapes, and a method of manufacturing such a panel. In particular, the present invention concerns a heat-insulating panel which also serves as a concrete form. The heat-insulating panel has excellent strength characteristics such, as bending strength and bending rigidity, and dimensional stability, as well as characteristics of sound absorption, heat-insulation, electrostatic shielding and electromagnetic wave absorption, and is usable for a concrete form when placing concrete during the construction of a building formed of reinforced concrete or steelframe reinforced concrete. The present invention relates also to a method of manufacturing the panel.

Conventionally, to improve the heat-insulation of a building formed of reinforced concrete or steelframe reinforced concrete for energy savings, a construction method has been utilized wherein heat-insulating panels using synthetic resin foams are directly attached to concrete wall surfaces.

The heat-insulating panel using a synthetic resin foam, however, does not have sufficient strength and cannot withstand the side pressure of concrete by itself when placing concrete, so that it must be attached to the inside of a supporting member, that is, a concrete frame such as a frame plywood, complicating the construction process. It further presents the following disadvantages: namely, the fixing between the frame and the heat-insulating panel is insufficient; when the heat-insulating panel is deformed due to the side pressure of concrete and thermal stress, concrete leaks into a space between the frame and the heat-insulating panel and the heat-insulation capability deteriorates; and after removal of the frame, the heat-insulating panel cannot ensure the smooth surface.

To eliminate the above disadvantages, a heat-insulating panel serving as a frame, for example in Japanese Patent KOKOKU Publication No. 5-47696 (1993), wherein a panel is reinforced by sticking a face plate on the surface of a synthetic resin foam so as to improve bending characteristics, and the panel itself can be used as a frame for placing concrete.

OBJECT AND SUMMARY OF THE INVENTION

However, when such a heat-insulating panel is used as a concrete frame when placing concrete during building construction using reinforced concrete or steelframe reinforced concrete, it has the following disadvantages:

To withstand the side pressure of uncured or unhardened concrete, the heat-insulating panel serving as a frame must have good bending characteristics and dimensional stability. Specifically, the panel has to have a bending strength of 50 kgf/cm$^2$ or more, and a bending rigidity of 4.0×10$^5$ kgf·cm$^2$. Furthermore, only 3 mm or less of the deflection of the frame surface is permitted between longitudinal battens upon placing unhardened concrete. Accordingly, the heat-insulating panel of this type has to have a face plate of a relatively high quality or a multi-layer face plate, resulting in increased costs. Moreover, the synthetic resin foam constituting a main member of the panel shows limitations in the compression strength and bearing strength. Accordingly, when the panel is used as a frame, the battens for supporting the frame may become sunk into the panel during construction.

In Japanese Patent Provisional Publication No. 6-198649 (1994), a method of manufacturing a building material board is proposed, which includes the steps of cutting or shredding waste magnetic tapes such as video tapes or cassette tapes in suitable lengths and heating them; and adding a binder to the cut or shredded pieces of tapes and compression-molding them.

When the building material board thus obtained is used as a frame, it becomes greatly deflected upon placing concrete because of its low bending rigidity.

An object of the present invention is to provide a heat-insulating panel which can be used as a frame for concrete placing and which has sufficient bending characteristics required for the frame and an excellent dimensional stability.

To solve the above-described problems, the present inventors have carried out extensive research on frames and panels and have found a new heat-insulating panel serving also as a concrete frame, which is obtained by compression-molding 100 parts by weight of curly contracted pieces of tapes added with 10 to 50 parts by weight of thermosetting resin as a binder, wherein the curly contracted pieces of tapes are obtained by heating of cut or shredded pieces of magnetic tapes having lengths of 20 mm or less; and a method of manufacturing the panel.

The above tape is not particularly limited insofar as being curly contracted, and may include a magnetic tape, such as a video tape or cassette tape. The cut pieces or shredded pieces of magnetic tapes preferably contain those having lengths from 5 to 20 mm in an amount of 50% or more on the basis of the total weight of the tapes. The above thermosetting resin is preferably at least one kind selected from a group consisting of phenol resin, urea resin, polyester resin, polyurethane resin, epoxy resin, and melamine resin.

Specifically, magnetic tapes, such as video tapes or cassette tapes, are cut or shredded into lengths of 20 mm or less, and heated at 100° to 200° C. to be curly contracted. The curly contracted pieces of magnetic tapes are then mixed with a binder of thermosetting resin and compression-molded under a pressure from 2 to 20 kgf/cm$^2$ and at a temperature from 100° to 200° C. Thus, a heat-insulating panel which also serves as a concrete frame and which has a bending strength of 50 kgf/cm$^2$ or more (the bending test using a particle board in accordance with JIS A 5908), a bending rigidity of 4×10$^5$ kgf·cm$^2$ or more, and the maximum deflection of 2 mm or less upon placing concrete. Moreover, the panel has characteristics of electromagnetic wave absorption and electrostatic shielding in addition to characteristics of sound absorption and heat-insulation. The above magnetic tapes may also be used in such a manner that part of tapes are not contracted into curled shapes and are left as being cut or shredded.

The tape is not limited in kind as described above, and may include a vinyl film, polyethylene film, polypropylene film, and cellulose film.

If magnetic tapes such as video tapes or cassette tapes are used, they are cut or shredded in lengths of 20 mm or less, preferably, 10 mm or less before heating; and they contain those having lengths from 5 to 20 mm in an amount of 50% or more, preferably 70% or more, on the basis of the total weight of tapes. When the length of each magnetic tape is more than 20 mm, the surface condition of the compression-molded tapes becomes coarse, and the strength required for a frame is reduced, making its practical use more difficult to find. When the cut pieces or shredded pieces contain those having lengths from 5 to 20 mm in an amount of less than 50% on the basis of the total weight of tapes, the tapes themselves cannot reinforce the bending strength sufficiently, thus making it difficult to obtain the strength characteristics required for a frame.

As the above binder, a material capable of being hardened and molded by heating, such as phenol resin, urea resin, polyester resin, polyurethane resin, epoxy resin or melamine resin, may be used. Each resin may be used in the form of powder or emulsion.

The above binder is added to 100 parts by weight of tapes, such as magnetic tapes, in an amount of 10 to 50 parts by weight, preferably, 15 to 30 parts by weight. When the amount of the binder is less than 10 parts by weight, the bonding force between tapes are not sufficient, and the strength characteristics required for a frame cannot be obtained. When it is more than 50 parts by weight, the strength becomes saturated, and further increases in the amount of the binder would simply result in increased costs.

The heat-insulating panel of the present invention is manufactured according to the following procedure:

Magnetic tapes, such as video tapes or cassette tapes, are cut or shredded in lengths of 20 mm or less, preferably, 3 to 10 mm, and heated at 100° to 200° C., preferably 140° to 170° C. to become contracted into curled shapes. The contracted tapes are mixed with a binder and compression-molded while being heated.

The heating temperature during the heat treatment is preferably in the range from 100° to 200° C. At a temperature of less than 100° C., the tapes may not contract into curly shapes. At a temperature more than 200° C., the tapes are deteriorated by oxidization and cannot be used as a panel.

The heating temperature during compression-molding should also be in the range from 100° to 200° C. At a temperature less than 100° C., the binder is not thermally hardened and does not allow the tapes to be compression-molded. At a temperature more than 200° C., the tapes are deteriorated by oxidization and cannot be used as a panel component.

As for the compression-molding pressure, if it is less than 2 kgf/cm$^2$, the tapes cannot be compression-molded into a panel. If it is more than 20 kgf/cm$^2$, the density of the panel may become too large to obtain a good heat-insulating capability.

BRIEF DESCRIPTION OF THE DRAWINGS

FIGS. 1A and 1B are perspective views each showing the shape of a contracted piece of a tape; and FIG. 2 is a perspective view of a cut piece of a heat-insulating panel serving as a concrete frame according to the present invention.

DETAILED DESCRIPTION OF THE PREFERRED EMBODIMENTS

FIG. 1A shows a contracted piece (a) formed in a spiral shape; and FIG. 1B is a curled contracted piece (b) of a tape which is C-shaped in section. Contracted pieces having various shapes may be used, other than the above pieces (a) and (b). However, either of these shapes is desirable to have a hollow portion C at the whole or part of the interior thereof.

FIG. 2 shows the cut piece of a heat-insulating panel obtained by a method wherein the curled contracted pieces of tapes are added with a binder, and then heated and compression-molded. At this time, simply cut pieces or shredded pieces of tapes may be added in a suitable amount. An actual panel is formed in a size of, for example, 5–25 mm (thickness)×400–1000 mm (length)×400–1000 mm (width).

In FIG. 2, reference numeral 1 designates a heat-insulating panel serving as a concrete frame; 2 contracted pieces of tapes bonded to each other by means of a binder; and 3 a nonwoven fabric stuck on the surface of the panel 1, which fabric is as thin as 0.1 to 0.001 mm.

When the above panel 1 is formed, ferrite, carbon black and conductive metal powder may be added together with the binder; or conductive metal fibers or metal meshes may be sandwiched in the panel 1.

According to the present invention, by adding the above binder to the above shredded tapes and compression-molding them, air is entrapped in the curly contracted pieces of tapes and spaces are formed inside thereof. Thus, there can be obtained a heat-insulating panel serving as a concrete frame having characteristics of electrostatic shielding and electromagnetic absorption in addition to characteristics of sound absorption and heat-insulation.

The panel of the present invention is used as a concrete frame for placing concrete. After the placed concrete is hardened, the panel is used as a wall material, ceiling member or floor member of a building in association with a concrete support 4, as shown in FIG. 2. In addition, the panel of the present invention may also be used alone without any concrete support.

EXAMPLE

In this example, the following materials were used.
Magnetic tape: Video tape sold by FUJI PHOTO FILM K.K.
Video tape sold by TDK K.K.
Urea resin: Urea resin MD-440 sold by DAINIPPON INK KOGYO.K.K.
Phenol resin: Phenol resin PR-311 sold by SUMITOMO DUREZ COMPANY, LTD.
Concrete to be placed:
Plain concrete manufactured by ASANO CONCRETE CO., LTD.
Slump: 21 cm
Nominal strength: 210 kgf/cm$^2$
Coarse aggregate maximum size: 20 mm First, the tapes were shredded into scale shapes having lengths of 5 mm or less by a shredder sold by TURBO KOGYO COMPANY, LTD under the trade name of TURBO-CUTTER. The shredded pieces of tapes were heated in an electric furnace for 3 min at 155°±5° C. while being agitated, thus forming curly contracted pieces of tapes. The curly contracted pieces of tapes as a raw material were mixed with a binder of the above-described resin, and were uniformly mixed in a Henschel mixer. The mixture was put in a transfer type mold, and was compression-molded by a hot-press under the condition of 150°×10 min.

The panel thus obtained had a size of 1800×900 mm and a specific gravity of 0.4.

A test piece having a size of 200×50 mm was subjected to a centralized load test (bending span: 150 mm) in accordance with a bending strength test for particle boards (JIS A 5908).

The bending rigidity was obtained by calculating Young's modulus from the relationship between the load and the deflection in the above bending strength test, and multiplying the value by the second moment of area.

The concrete placing test was performed using a wall having a height of 3600 mm and a thickness of 200 mm. The concrete placing rate was set at 20 m/h. The maximum deflection was obtained by measuring the deflection at the center of a gap between longitudinal battens by means of electric calipers, and obtaining the maximum value from the measured values.

| Inventive and Comparative Examples | Inv. Ex. 1 | | Inv. Ex. 2 | | Inv. Ex. 3 | | Inv. Ex. 4 | | Inv. Ex. 5 | | Inv. Ex. 6 | |
|---|---|---|---|---|---|---|---|---|---|---|---|---|
| mixing ratio | | | | | | | | | | | | |
| magnetic tape | | | | | | | | | | | | |
| length of tape (5–20 mm) | 50 parts by weight | | | | 50 parts by weight | | | | 70 parts by weight | | | |
| length of tape less than 5 mm | 50 parts by weight | | | | 50 parts by weight | | | | 30 parts by weight | | | |
| length of tape 20 mm or more | — | | | | — | | | | | | | |
| binder | | | | | | | | | | | | |
| kind | urea resin | | | | phenol resin | | | | urea resin | | | |
| amount (parts by weight) | 15 | | 25 | | 15 | | 25 | | 15 | | 25 | |
| panel thickness (mm) | 20 | 25 | 20 | 25 | 20 | 25 | 20 | 25 | 20 | 25 | 20 | 25 |
| strength characteristics | | | | | | | | | | | | |
| bending strength[1] (kgf/cm$^2$) | 65.1 | 51.0 | 81.8 | 69.2 | 64.0 | 51.6 | 66.8 | 59.3 | 87.2 | 64.0 | 98.3 | 82.6 |
| bending rigidity[2] ($\times 10^5$ kgf·cm$^2$) | 3.7 | 4.6 | 4.5 | 6.2 | 3.6 | 4.8 | 4.2 | 5.3 | 4.9 | 6.8 | 5.9 | 7.5 |
| concrete placing test[3] | | | | | | | | | | | | |
| maximum deflection[2] (mm) | 2.7 | 2.0 | 2.2 | 1.7 | 2.8 | 2.2 | 2.3 | 1.9 | 2.0 | 1.6 | 1.7 | 1.3 |
| evaluation of deflection[4] | □ | ○ | □ | ○ | □ | □ | □ | ○ | ○ | ○ | ○ | ○ |

[1] bending strength test using particle board (JIS A 5908)
[2] panel width: 910 mm
[3] gap between battens: 200 mm
placing rate: 20 m/h
placing height: 3.6 m
specification of placing concrete: plain concrete, slump (21 cm), maximum size of coarse aggregate (20 mm)
[4] maxmimum deflection
2.0 mm or less: ○
2.0–3.0 mm: □
3.0 mm or more: X

| Inventive and Comparative Examples | Inv. Ex. 7 | | Inv. Ex. 8 | | Comp. Ex. 1 | | Comp. Ex. 2 | | Comp. Ex. 3 | | Comp. Ex. 4 | |
|---|---|---|---|---|---|---|---|---|---|---|---|---|
| mixing ratio | | | | | | | | | | | | |
| magnetic tape | | | | | | | | | | | | |
| length of tape 5–20 mm | 70 parts by weight | | | | 30 | | 50 | | 70 | | conventional frame panel using synthetic resin foam | |
| length of tape less than 5 mm | 30 parts by weight | | | | 70 | | 30 | | 30 | | | |
| length of tape 20 mm or more | — | | | | — | | 20 | | — | | | |
| binder | | | | | | | | | | | | |
| kind | phenol resin | | | | urea resin | | | | | | | |
| amount (parts by weight) | 15 | | 25 | | 25 | | 25 | | 10 | | | |
| panel thickness (mm) | 20 | 25 | 20 | 25 | 20 | 25 | 20 | 25 | 20 | 25 | 25 | 30 |
| strength characteristics | | | | | | | | | | | | |

-continued

| Inventive and Comparative Examples | Inv. Ex. 7 | | Inv. Ex. 8 | | Comp. Ex. 1 | | Comp. Ex. 2 | | Comp. Ex. 3 | | Comp. Ex. 4 | |
|---|---|---|---|---|---|---|---|---|---|---|---|---|
| bending strength[1] (kgf/cm$^2$) | 85.8 | 67.1 | 95.6 | 72.3 | 47.3 | 35.9 | 34.9 | 23.8 | 19.6 | 15.8 | 26.2 | 19.1 |
| bending rigidity[2] ($\times 10^{-5}$ kgf·cm$^2$) | 4.9 | 6.0 | 5.6 | 7.7 | 2.7 | 3.3 | 1.9 | 2.4 | 1.3 | 1.5 | 1.5 | 1.9 |
| concrete placing test[3] maximum deflection[2] (mm) | 2.0 | 1.6 | 1.8 | 1.5 | 3.9 | 3.2 | 4.6 | 4.1 | 6.4 | 5.7 | 5.3 | 4.7 |
| evaluation of deflection[4] | o | o | o | o | X | X | X | X | X | X | X | X |

[1] bending strength test using particle board (JIS A 5908)
[2] panel width: 910 mm
[3] gap between battens: 200 mm
placing rate: 20 m/h
placing height: 3.6 m
specification of placing concrete: plain concrete, slump (21 cm), maximum size of coarse aggregate (20 mm)
[4] maximum deflection
2.0 mm or less: o
2.0–3.0 mm: □
3.0 mm or more: X The heat-insulating panel using contracted pieces of magnetic tapes according to the present invention is large in bending strength and bending rigidity, excellent in dimensional stability and small in deflection, and thereby it is usable as a panel serving also as a concrete frame used in the construction of a building which is formed of steelframe reinforced concrete or reinforced concrete. Since the obtained panel has small spaces formed by contracted pieces of magnetic tapes inside the board, it absorbs electromagnetic wave and shields electrostatic fields, in addition to its sound absorption and heat-insulation properties.

We claim:

1. A method of manufacturing a heat-insulating panel serving as a concrete frame comprising the steps of:
   cutting or shredding magnetic tapes, such as video tapes or cassette tapes, in lengths of 20 mm or less;
   heating said cut or shredded pieces of magnetic tapes at a temperature from 100° to 200° C., thereby obtaining curled contracted pieces of magnetic tapes;
   adding a thermosetting resin binder to said curled contracted pieces of magnetic tapes; and
   compression-molding said curled contracted pieces of magnetic tapes mixed with said binder at a temperature from 100° to 200° C.

2. A method of manufacturing a heat-insulating panel serving as a concrete frame comprising the steps of:
   preparing contracted pieces having lengths of 20 mm or less of magnetic tapes, such as video tapes or cassette tapes, said cut or shredded pieces containing those having lengths from 5 to 20 mm in an amount of 50% or more on the basis of the total tape weight;
   adding 10 to 50 parts by weight of a thermosetting resin binder to 100 parts by weight of said contracted pieces of magnetic tapes, said binder comprising a material capable of becoming hard and molded by heating, at least one selected from the group consisting of phenol resin, urea resin, polyester resin, polyurethane resin, epoxy resin or melamine resin; and
   compression-molding said contracted pieces of magnetic tapes added with said binder under a pressure from 2 to 20 kgf/cm$^2$ at a temperature from 100° to 200° C.

* * * * *